US006973636B2

(12) United States Patent
Shin et al.

(10) Patent No.: US 6,973,636 B2
(45) Date of Patent: Dec. 6, 2005

(54) METHOD OF DEFINING FORBIDDEN PITCHES FOR A LITHOGRAPHY EXPOSURE TOOL

(75) Inventors: Jaw-Jung Shin, Hsin-Chu (TW); Chun-Kuang Chen, Taoyuang (TW); Tsai-Sheng Gau, San-Chung (TW); Burn-Jeng Lin, Hsin-Chu (TW); Li-Chun Tien, Hsin-Chu (TW); Mi-Chang Chang, Hsin-Chu (TW); Yu-Jun Chou, Taipei (TW); Jan-Wen You, Taoyuang (TW); King-Chang Shu, Taipei (TW); Li-Jui Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 203 days.

(21) Appl. No.: 10/688,500

(22) Filed: Oct. 17, 2003

(65) Prior Publication Data

US 2005/0086629 A1    Apr. 21, 2005

(51) Int. Cl.[7] .............................................. G06F 17/50
(52) U.S. Cl. ........................................ 716/19; 716/21
(58) Field of Search .............................. 716/4, 19–21; 430/5, 30

(56) References Cited

U.S. PATENT DOCUMENTS

| 5,242,770 | A | 9/1993 | Chen et al. |
| 6,046,792 | A | 4/2000 | Van Der Werf et al. |
| 6,094,305 | A | 7/2000 | Shiraishi |
| 6,519,760 | B2 | 2/2003 | Shi et al. |
| 6,584,609 | B1 | 6/2003 | Pierrat et al. |
| 6,871,337 | B2 * | 3/2005 | Socha .......................... 716/19 |
| 2002/0152452 | A1 * | 10/2002 | Socha .......................... 716/21 |

* cited by examiner

Primary Examiner—Paul Dinh
(74) Attorney, Agent, or Firm—Slater & Matsil, L.L.P.

(57) ABSTRACT

A method of identifying and defining forbidden pitches or forbidden pitch ranges for a lithographic exposure tool under a given set of exposure conditions is provided. In the method, a computer simulation is performed, and its results are compared to frequently used pitches to see if such frequently used pitches may yield depth-of-focus (DOF) values greater than the focus budget for the exposure tool. If so, a verification test is performed by using a test mask and actually exposing a surface with the same pattern pitches simulated. From this, actual DOF values are obtained and compared to the focus budget of the exposure tool. Any pitches having a DOF value greater than the focus budget are designated as forbidden pitches. This forbidden pitch information may be integrated into a design rule to restrict the use of such forbidden pitches under the given exposure conditions where they are likely to arise.

29 Claims, 4 Drawing Sheets

METHOD OF DEFINING FORBIDDEN PITCHES FOR A LITHOGRAPHY EXPOSURE TOOL

TECHNICAL FIELD

The present invention generally relates to the fabrication of semiconductor devices. In one aspect it relates more particularly to a method of constraining chip design rules from the use of identified/defined forbidden pitches and/or forbidden pitch ranges.

BACKGROUND

Lithographic processes are often used in the manufacture of integrated circuits (ICs) for semiconductor devices. In such processes, a mask having a circuit pattern corresponding to an individual layer of an IC is typically used. In such case, a projection beam of radiation may be used to image this mask pattern onto various target portions on a wafer (e.g., silicon wafer, silicon-on-insulator wafer) that has been coated with a layer of radiation-sensitive material (e.g., photoresist material). Such techniques are widely known in the art of semiconductor manufacturing.

Lithographic apparatus may employ various types of projection radiation, such as (but not necessarily limited to): ultra-violet light (UV) radiation (e.g., with a wavelength of 365 nm, 248 nm, 193 nm, 157 nm or 126 nm), extreme UV (EUV), X-rays, ion beams, or electron beams, for example. As semiconductor manufacturing technology pushes towards the limits of optical lithography, the state-of-the-art processes to date have regularly produced ICs with features exhibiting critical dimensions (CDs) below the exposure wavelength ($\lambda$). A "critical dimension" of a circuit is often defined as the smallest width of a feature or the smallest space between two features. For feature patterns that are designed to be smaller than the exposure wavelength, it has been recognized that the optical proximity effect (OPE) becomes much more severe. The OPE becomes intolerable or unacceptable in some cases for leading edge sub-exposure-wavelength production processes.

Optical proximity effects are a well-known characteristic of optical projection exposure tools. Typically, OPEs occur when very closely spaced circuit patterns are lithographically transferred to a resist layer on a wafer. The light waves of the closely spaced circuit features interact, thereby distorting the final transferred pattern features. In other words, diffraction causes adjacent features to interact with each other in such a way as to produce pattern dependent variations. The magnitude of the OPE on a given feature usually depends on the feature's placement on the mask with respect to other features.

One of the primary problems caused by such OPEs is an undesirable variation in feature CDs. For leading edge semiconductor processes, achieving tight control over the CDs of the features (i.e., circuit elements and interconnects) is an important manufacturing goal because this has a direct impact on wafer sort yield and speed-binning of the final product. It has been known that variations in the CDs of circuit features caused by OPE may be reduced by several methods. One such technique involves adjusting the illumination characteristics of the exposure tool, for example. OPE can also be compensated for by "pre-correcting" the mask features (e.g., using scattering bars, intensity leveling bars, or assist bars). This family of techniques is generally known as optical proximity correction (OPC).

It is generally understood that the process latitude associated with dense structures is better than that associated with isolated structures under conventional illumination for larger feature sizes. However, recently, more aggressive illumination schemes such as annular illumination and multipole illumination have been implemented as a means of improving resolution for smaller feature sizes. When utilizing such illumination schemes, some optical phenomena have become more prominent. In particular, a forbidden pitch phenomenon has become more prominent. More specifically, there are pitch ranges within which the process latitude of a "densely located" main feature, especially the exposure latitude, may be worse than that of an isolated feature of the same size. This observation indicates that the existence of the neighboring feature is not always beneficial for main feature printing. Thus, the forbidden pitch phenomenon has become a limiting factor in advanced photolithography. As such, suppressing the forbidden pitch phenomenon will generally improve the CDs and process latitude obtainable utilizing currently known semiconductor device manufacturing tools and techniques. Hence, there is a need for manufacturing methods and techniques which avoid the use of forbidden pitch ranges.

SUMMARY OF THE INVENTION

The problems and needs outlined above are addressed by embodiments of the present invention. In accordance with one aspect of the present invention, a method of identifying forbidden pitches for a lithographic exposure tool, is provided. This method includes the following steps, the order of which may vary. A set of exposure conditions is selected. A simulation of an actual lithographic exposure process is performed using a computer model. The performing of the simulation includes: selecting a set of pattern pitches for a certain target critical dimension, and running the computer model using the selected set of exposure conditions for at least some of the pattern pitches from the set of pattern pitches to obtain a corresponding set of depth-of-focus (DOF) values for each pitch ran. It is next determined whether the DOF values are greater than a focus budget of the exposure tool for a set of frequently used pitches. If the DOF values are not greater than the focus budget of the exposure tool for the set of frequently used pitches, a new set of exposure conditions is selected and the simulation is re-performed using the new set of exposure conditions. If the DOF values are greater than the focus budget of the exposure tool for the set of frequently used pitches, a verification test is performed. The verification test includes: providing a test mask having formed therein at least one of the pattern pitches used in a last performed simulation; exposing a wafer through the test mask using the exposure tool and using the set of exposure conditions of the last performed simulation; and determining an actual DOF value for at least one of the exposed pattern pitches. For at least some of the exposed pattern pitches, the corresponding actual DOF value is compared with the focus budget of the exposure tool. If the actual DOF value is not greater than the focus budget of the exposure tool, that actual DOF value's corresponding pattern pitch is designated as a forbidden pitch. The exposure tool may refer to a certain make or model of exposure tool, or one particular exposure tool, for example. The test mask may have formed therein only one of the pattern pitches used in the last performed simulation (which may or may not be among other patterns formed in the test mask). As another example, the test mask may have formed therein all of the pattern pitches used in the last performed simulation. The set of frequently used pitches may consist of one pitch, or two or more pitches. The set of exposure conditions may include a numerical aperture value, a sigma value, an illumination condition, or any combination thereof, for example.

In accordance with another aspect of the present invention, a method of adding information about forbidden pitches for a lithography exposure tool to a design rule relating to fabrication of semiconductor devices, is provided. This method includes the following steps, the order of which may vary. A set of exposure conditions is selected. A simulation of an actual lithographic exposure process is performed using a computer model. The performing of the simulation includes: selecting a set of pattern pitches for a certain target critical dimension, and running the computer model using the selected set of exposure conditions for at least some of the pattern pitches from the set of pattern pitches to obtain a corresponding set of depth-of-focus (DOF) values for each pitch ran. It is determined whether the DOF values are greater than a focus budget of the exposure tool for a set of frequently used pitches. If the DOF values are not greater than the focus budget of the exposure tool for the set of frequently used pitches, a new set of exposure conditions is selected and the simulation is re-performed using the new set of exposure conditions. If the DOF values are greater than the focus budget of the exposure tool for the set of frequently used pitches, a verification test is performed. The verification test includes: providing a test mask having formed therein at least one of the pattern pitches used in a last performed simulation; exposing a wafer through the test mask using the exposure tool and using the set of exposure conditions of the last performed simulation; and determining an actual DOF value for at least one of the exposed pattern pitches. For at least some of the exposed pattern pitches, the corresponding actual DOF value is compared with the focus budget of the exposure tool. If the actual DOF value is not greater than the focus budget of the exposure tool, that actual DOF value's corresponding pattern pitch is designated as a forbidden pitch. Information about the forbidden pitch(es) for the exposure tool is added to the design rule.

In accordance with yet another aspect of the present invention, a method of constraining a design rule relating to fabrication of semiconductor devices is provided. This method includes the following steps, the order of which may vary. A set of exposure conditions is selected. A simulation of an actual lithographic exposure process is performed using a computer model. The performing of the simulation includes: selecting a set of pattern pitches for a certain target critical dimension, and running the computer model that simulates an exposure tool using the selected set of exposure conditions for at least some of the pattern pitches from the set of pattern pitches to obtain a corresponding set of depth-of-focus (DOF) values for each pitch ran. It is determined whether the DOF values are greater than a focus budget of the exposure tool for a set of frequently used pitches. If the DOF values are not greater than the focus budget of the exposure tool for the set of frequently used pitches, a new set of exposure conditions is selected and the simulation is re-performed using the new set of exposure conditions. If the DOF values are greater than the focus budget of the exposure tool for the set of frequently used pitches, a verification test is performed. The verification test includes: providing a test mask having formed therein at least one of the pattern pitches used in a last performed simulation; exposing a wafer through the test mask using the exposure tool and using the set of exposure conditions of the last performed simulation; and determining an actual DOF value for at least one of the exposed pattern pitches. One or more forbidden pitch ranges is defined based on the actual DOF values from the verification test performed. The defining of each forbidden pitch range includes: for at least some of the exposed pattern pitches, comparing the corresponding actual DOF value with the focus budget of the exposure tool; if the actual DOF value is not greater than the focus budget of the exposure tool, designating that actual DOF value's corresponding pattern pitch as a forbidden pitch; identifying groups of adjacent forbidden pitches, if any; and forming the forbidden pitch range based on the identified groups of adjacent forbidden pitches. The information regarding the defined forbidden pitch range(s) is integrated into the design rule such that the defined forbidden pitch range(s) may be restricted from use.

BRIEF DESCRIPTION OF THE DRAWINGS

The following is a brief description of the drawings, which show illustrative embodiments of the present invention and in which.

DETAILED DESCRIPTION OF ILLUSTRATIVE EMBODIMENTS

Figure 1:
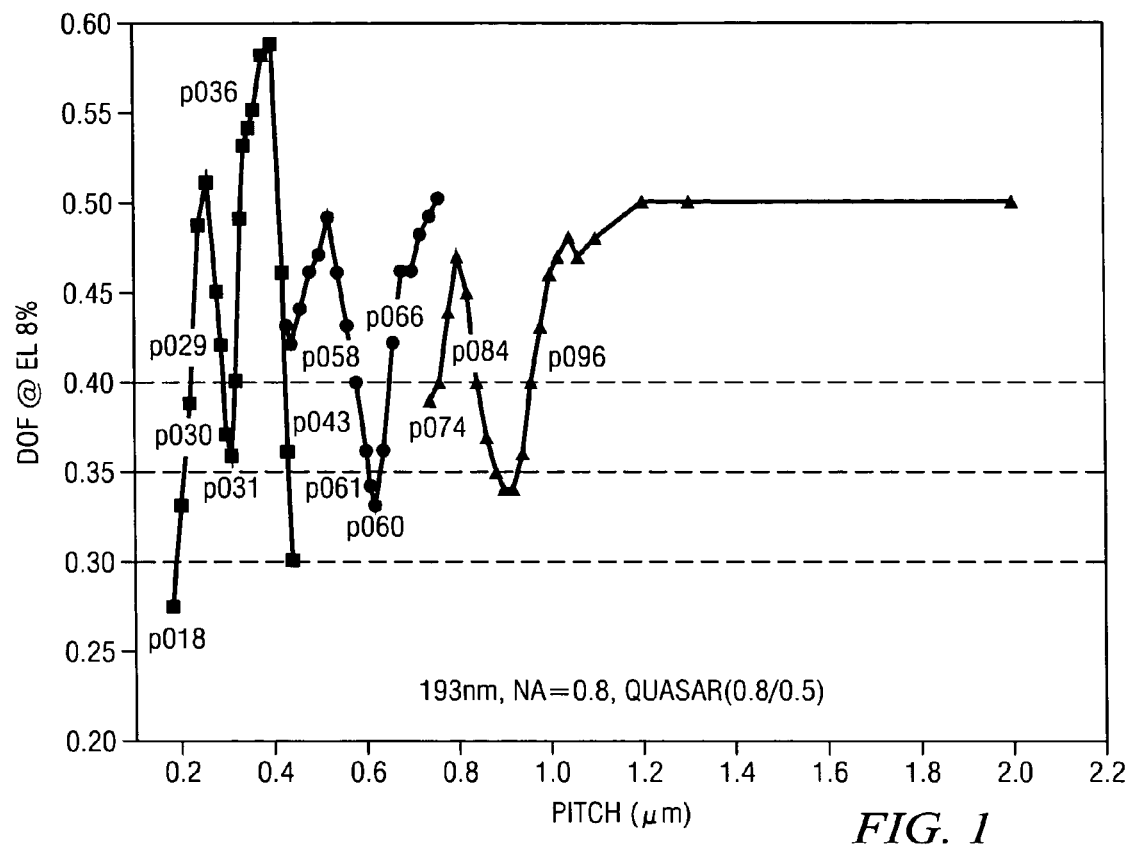
FIG. 1 is a plot of depth-of-focus (DOF) versus layout pattern pitch for a given set of exposure conditions of a given exposure tool.

Referring now to the drawings, wherein like reference numbers are used herein to designate like elements throughout the various views, an illustrative embodiment of the present invention is shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiment of the present invention.

A semiconductor device foundry often manufactures many different types and generations of devices. Hence, it is desirable that the process windows for lithography processes using existing exposure tools be large enough to cover many kinds of layout patterns while following the design rules for each technology generation. However, the lithography process window of current or prior technology generations may not cover all pitches of layout patterns for new or future technology generations. As discussed above, the problem of forbidden pitches has begun to be more and more an issue as the device geometries and layout pitches continue to decrease in size relative to the wavelength of the exposure tools used. To address the problem of forbidden pitches, an embodiment of the present invention provides a way to identify the forbidden pitches or ranges of forbidden pitches. After identifying the forbidden pitches or the forbidden pitch range(s) for a given exposure tool, such information about the forbidden pitches may be (and preferably is) integrated into design rules to constrain or restrict the use of the forbidden pitches in a layout. Hence, lithography-friendly design rules may be developed and used in the design and production of semiconductor devices that take into account the forbidden pitch phenomena. This should provide the benefit of good critical dimension uniformity and improved critical dimension uniformity control. Also, the use of such lithography-friendly design rules may help maintain or improve chip performance and yield for current and future technology generations.

Figure 2A:
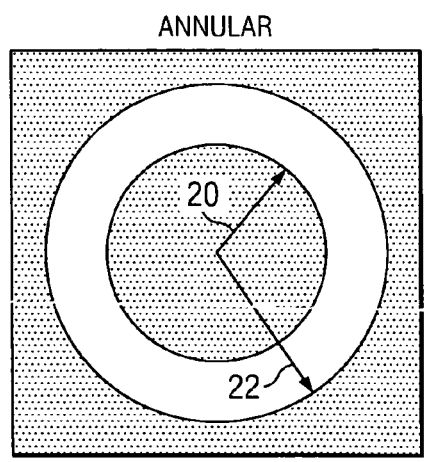
FIGS. 2A and 2B show two illustrative illumination definitions that are commonly used in advanced lithography processes.
Figure 2B:
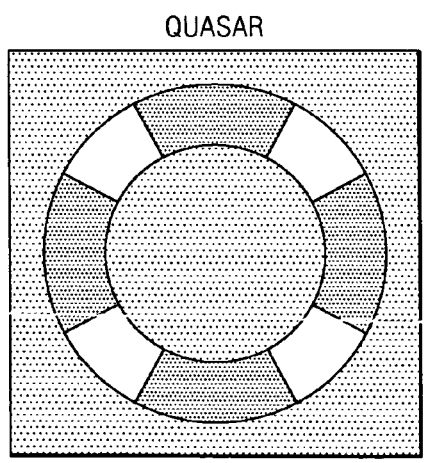

FIG. 1 is a graph showing some example depth-of-focus (DOF) measurements (vertical axis of graph) for a given set of exposure conditions on a given exposure tool as the layout pattern pitch varies (horizontal axis of graph). Specifically, the DOF data in FIG. 1 was obtained for an exposure light wavelength of about 193 nm, a numerical aperture (NA) of about 0.8, and using a QUASAR illumination definition having an inner sigma of about 0.5 and an outer sigma of about 0.8. FIGS. 2A and 2B show two types of illumination definitions, an annular and a QUASAR, respectively. These illumination definitions shown in FIGS. 2A and 2B are sometimes used in advanced lithography. Each of the illumination definitions shown in FIGS. 2A and 2B has an inner sigma 20 and an outer sigma 22.

Each make of exposure tool and/or each exposure tool has a focus budget. "Focus budget" refers a minimum DOF requirement of a photolithography process to cover focus variations of an exposure tool. Hence, if an actual DOF at a given layout pattern pitch is not greater than the focus budget required by the exposure tool, such layout pattern pitch is considered a forbidden pitch. In some cases there will be a range of forbidden pitches.

Referring to FIG. 1, this example data may help illustrate forbidden pitches and forbidden pitch ranges. If the focus budget of the exposure tool simulated and/or tested to provide the DOF data in FIG. 1 is 0.40 $\mu$m, then the forbidden pitches are located from about 0.29 $\mu$m to about 0.32 $\mu$m, from about 0.58 $\mu$m to about 0.66 $\mu$m, and from about 0.84 $\mu$m to about 0.96 $\mu$m (i.e., three ranges of forbidden pitches). Still referring to FIG. 1, if the focus budget of the exposure tool simulated and/or tested is instead 0.35 $\mu$m, then the forbidden pitches are located from about 0.59 $\mu$m to about 0.61 $\mu$m, and from about 0.88 $\mu$m to about 0.92 $\mu$m (i.e., two ranges of forbidden pitches).

Figure 3:
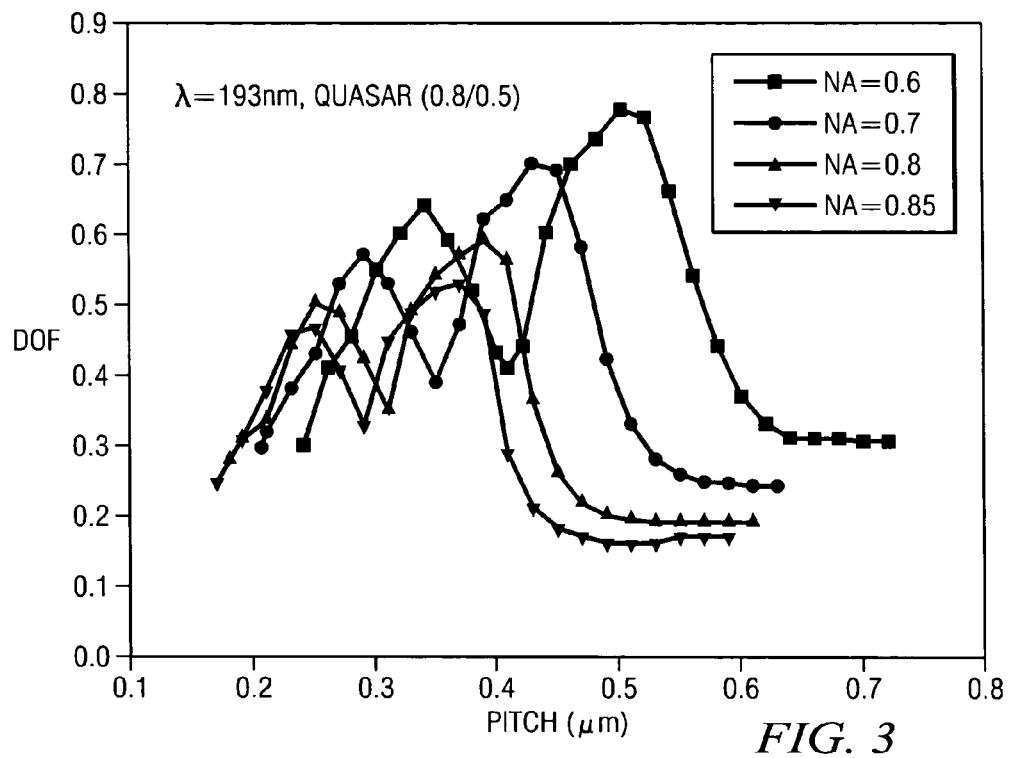
FIG. 3 is a plot of depth-of-focus (DOF) versus layout pattern pitch for various numerical apertures with fixed sigma of a given exposure tool.

For some device layouts or preferred device layouts, there are frequently used pitches. If a frequently used pitch falls within a forbidden pitch range or happens to be a forbidden pitch for a given set of exposure conditions of an exposure tool, it may be possible to change to the exposure conditions so that the frequently used pitch is no longer within a forbidden pitch range. FIG. 3 shows more illustrative DOF data taken at various layout pitch patterns. In FIG. 3, four sets of DOF data are shown for four different values of NA (i.e., 0.6, 0.7, 0.8, and 0.85). In this data graphed in FIG. 3, the exposure wavelength and the QUASAR sigma values are the same for all four sets of DOF data. Note that by varying the NA, for example, the forbidden pitch ranges (i.e., the dips in the DOF-pitch curve) vary for each NA. Thus, if the forbidden pitch range falls on a frequently used pitch, the exposure conditions may be varied to shift the forbidden pitch range to a different position along the pitch axis and/or along the DOF axis (see e.g., FIG. 3).

Figures 4, 6:
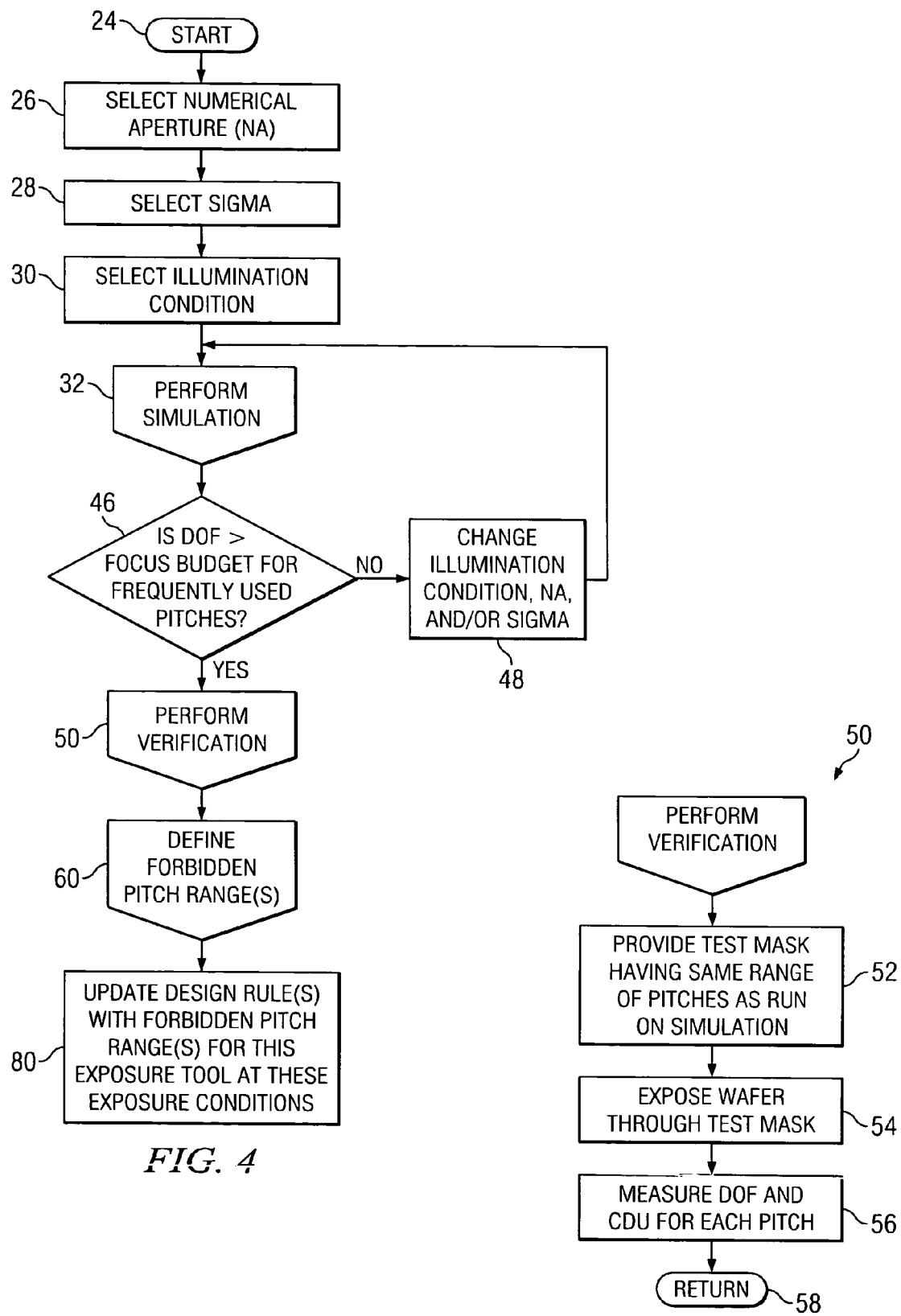

Next, an illustrative embodiment for a method of the present invention will be described. FIGS. 4–7 are flowcharts representing some of the steps of the illustrative method of the present invention. Referring to FIG. 4, beginning at the start block 24, the exposure conditions are selected. For example, the numerical aperture (NA), sigma, and illumination condition (e.g., QUASAR) may be selected, as shown in blocks 26, 28, and 30, respectively, in FIG. 4.

Figure 5:
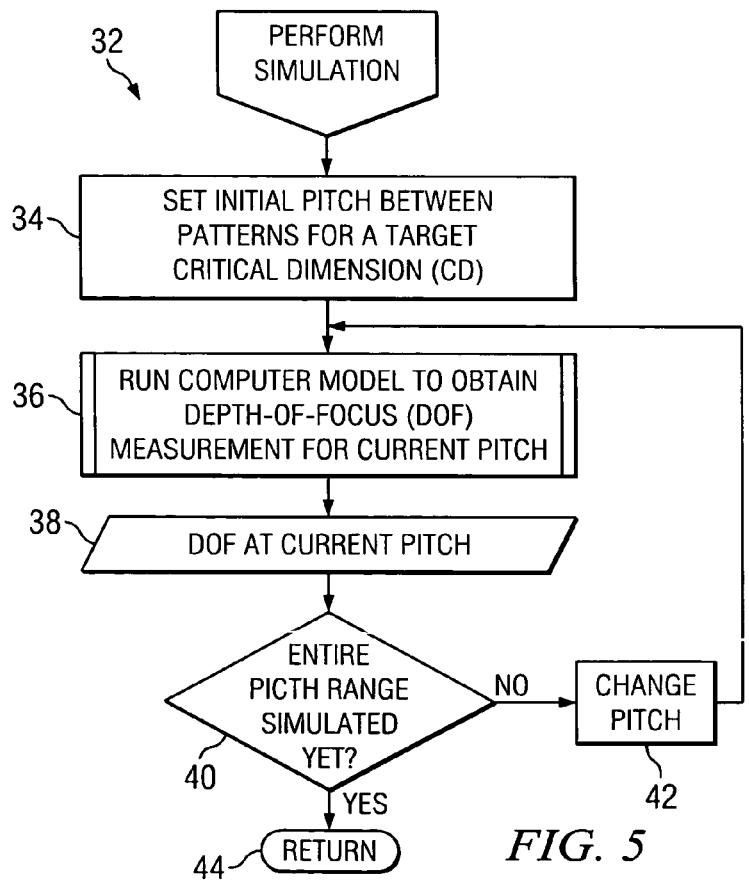
FIGS. 4–7 are flowcharts representing steps of an illustrative method of the present invention.

Next, a simulation is performed (block 32). The details of performing the simulation for this example are shown in FIG. 5. An initial pitch between patterns for a target CD is selected or set (see block 34 in FIG. 5). A computer model is run using the initial pitch to obtain DOF values for the initial pitch (see block 36). Hence, the data output from running the computer model includes the DOF at the current pitch (see data block 38). The computer model may be based upon a particular make/model of exposure tool, or more specifically, for a particular exposure tool that will be actually used in manufacturing. The phrases "exposure tool" or "a given exposure tool" may be used herein to refer to either case, as either case may be used. It is next determined whether the entire range of pitches desired to be simulated has been run yet (see decision block 40). If not, the pitch setting is changed for running another pitch (see block 42). The pitch setting (initially and thereafter) may be changed or selected automatically as part of a software algorithm using predetermined pitch values in a list or may be manually selected by prompting a user for the information, for example. The computer model is run again (see block 36) for each pitch in the desired set of pitches to develop of set of DOF data corresponding to a set of pitches, such as the set(s) of data graphed in FIG. 1 or FIG. 3, for example. In an alternative embodiment, one or more (e.g., some or all) of the pitches may be selected/set and run on a computer model, rather than running them one at a time as shown in FIG. 5. Upon completion of the simulation (see return block 44), the process of FIG. 4 is continued.

Referring again to FIG. 4, it is determined whether the DOF (from the simulation) is greater than the focus budget of the exposure tool for frequently used pitches (see decision block 46). Such frequently used pitches may be determined by a user, may be drawn from an existing design rule, may be dictated by current or future design plans, may be predetermined parameters provided within or by a software algorithm, or any combination thereof, for example. If the DOF is not greater than the focus budget for some set or group of frequently used pitches, then it will likely be preferred to use different exposure conditions as such frequently used pitches are anticipated for use already. In such case, one or more of the exposure conditions may be changed to a new value (see block 48). As illustrated in FIG. 3 for varying the NA, changing one or more of the exposure conditions may provide a different set of DOF values for a given range or set of pitches.

If the DOF is greater than the focus budget for frequently used pitches, then the process proceeds to performing a verification (see block 50). Example steps of performing a verification are shown in FIG. 6. A test mask is provided with one or more pattern pitches formed therein. Preferably, each set of pitches simulated is provided on the test mask so that the verification test matches the simulation (see block 52). But in another embodiment, not all of the pitches simulated and/or some addition pitches may be provided on one or more of the test masks. A wafer or some other surface is then exposed through the test mask (see block 54) using the exposure tool of interest and preferably using the same exposure conditions that were successful in the simulation (i.e., where the DOF values were greater than the focus budget for frequently used pitches). Next, DOF and critical dimension measurements are obtained from the test wafer (see block 56). The critical dimension values may be used to check the CD uniformity (CDU). If multiple pitches are provided on a single test mask, a set of corresponding DOF values may be provided by the test wafer after exposing the wafer through the test mask. In another embodiment, multiple test masks may be used to provide multiple sets of exposures on one or more test wafers (e.g., if only one or a few patterns are provided on each test mask). After performing the verification test(s), the process of FIG. 4 may be continued (see return block 58 in FIG. 6).

Figure 7:
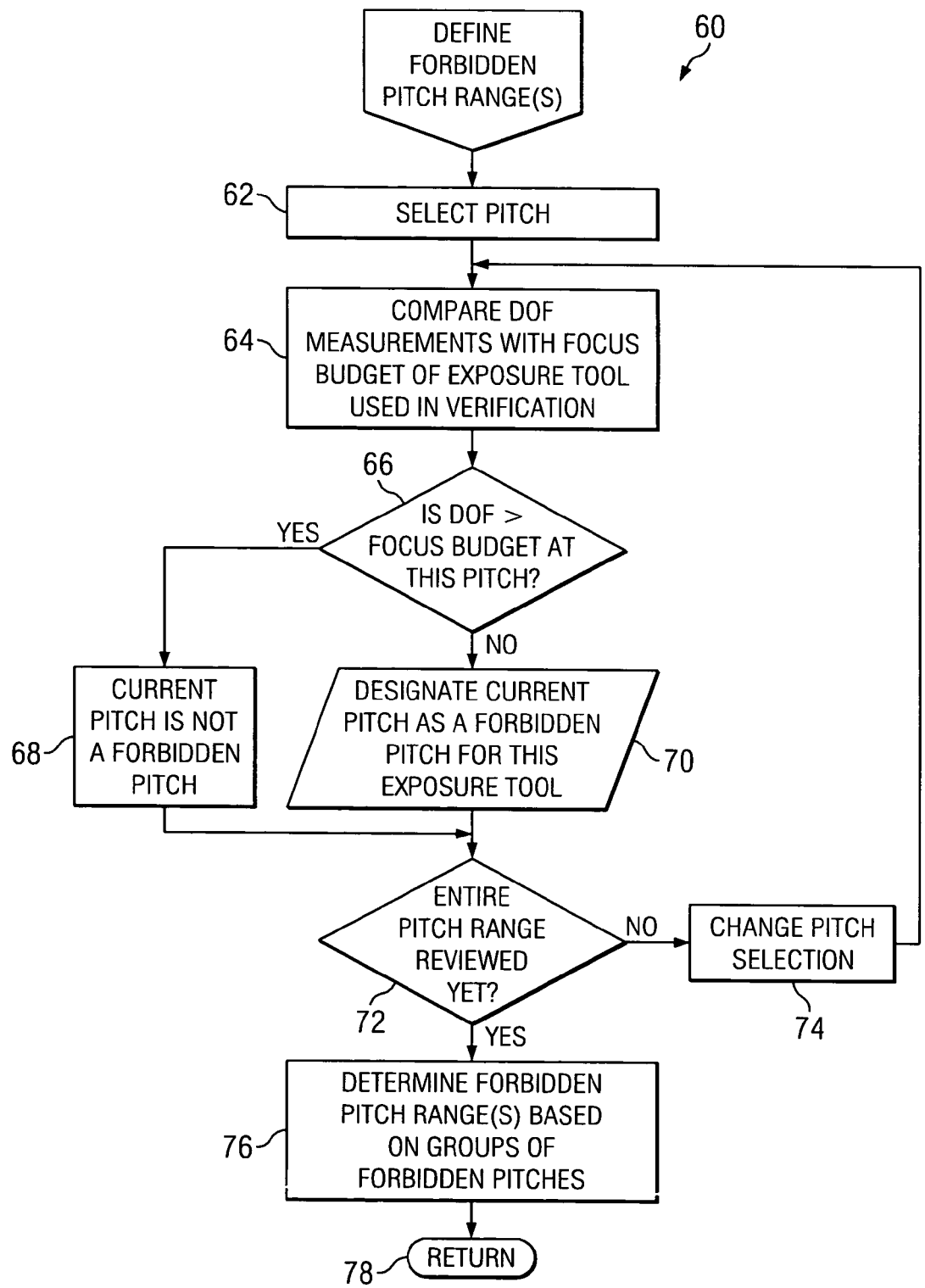

Referring again to FIG. 4, the forbidden pitch(es) and/or forbidden pitch range(s) may be defined using the test results from the actual exposure or the test mask (see block 60 in FIG. 4). In the embodiment illustrated in FIGS. 4–7, forbidden pitch range(s) are defined. In alternative, individual, groups, or sets of forbidden pitch(es) may be defined, rather than a range or ranges. A sub-process 60 of defining a forbidden pitch range or ranges (depending on the number of ranges revealed from the testing) is shown in FIG. 7. To start the definition sub-process 60, one of the pitches tested is selected (see block 62), but the order of pitches selected is typically not important to this sub-process. The DOF measurement from the verification testing, which corresponds to the currently selected pitch, is compared to the focus budget of the exposure tool (preferably the same exposure tool used in the verification testing) (see block 64).

Still referring to FIG. 7, it is next determined whether the DOF value is greater than the focus budget at this pitch (see decision block 66). If the DOF is greater than the focus budget, then the current pitch is not a forbidden pitch (see block 68). Conversely, if the DOF is not greater than the focus budget, then the current pitch is designated as a forbidden pitch for this exposure tool (see data block 70). Next, it is determined whether the entire range of tested pitches (i.e., their corresponding DOF values) have been reviewed yet (see decision block 72). If not, another pitch is selected (see block 74) and the comparison steps are repeated (see blocks 64 and 66). Hence, the comparisons are preferably repeated until the complete set of DOF values from the verification testing is compared to the focus budget. In an alternative embodiment, some or all of the pitches and DOF values may be selected at once and compared to the focus budget simultaneously or in rapid succession.

After the forbidden pitches are identified and designated (e.g., a list of the forbidden pitches), forbidden pitch ranges may be discerned from the forbidden pitch data (see block 76). For example, sets of adjacent forbidden pitch values (i.e., forbidden pitches not having a non-forbidden pitch there between them) may be grouped together to aid in the identification of a range of forbidden pitches. When a limited number of pitches are tested, as shown in FIG. 1 for example, a range of forbidden pitches may begin and end with the last non-forbidden pitch before the set and the first non-forbidden pitch after the set, respectively, to ensure that all forbidden pitches on the edges of the range are covered by the range. Increasing the number of pitches tested (assuming they are evenly or somewhat evenly distributed) should increase the precision of the end points of the designated forbidden pitch range(s). After the forbidden pitch(es) or forbidden pitch range(s) are defined (e.g., as in FIG. 7), the process of FIG. 4 may be continued (see return block 78).

As an optional and preferred step in the process of FIG. 4, one or more design rules may be updated with the information regarding the forbidden pitch(es) or forbidden pitch range(s) for the exposure tool at the exposure conditions verified (see block 80). As discussed above, such information may be valuable and useful for a design rule. For example, if a process of the present invention has been performed to provide information about forbidden pitches for a given exposure tool, and such information has been integrated into a design rule, then designers of a chip layout and/or a manufacturing process may take into account the forbidden pitches and avoid parameters or conditions that may result in a forbidden pitch phenomenon.

As another embodiment and application of the present invention, the flowchart of FIG. 4 may be continued with other additional steps. For example, after the forbidden pitch(es) and/or forbidden pitch range(s) have been defined and implemented into design rule(s), an updated design rule having the forbidden pitch information implemented therein may be used while drawing an IC layout and preferably to prevent the drawing of forbidden pitches in the IC layout. As another example, after the forbidden pitch(es) and/or forbidden pitch range(s) have been defined using an embodiment of the present invention, a software tool may check for or search for the presence of a forbidden pitch in an IC layout. In another embodiment, after checking for or searching for the defined forbidden pitch(es), a software tool may itself or may be used to modify an IC layout where a forbidden pitch was found and implement an allowed pitch in alternative to the forbidden pitch. With the benefit of this disclosure, one of ordinary skill in the art should realize the usefulness and applications of having and implementing forbidden pitch information provided by an embodiment of the present invention. Furthermore, with the benefit of this disclosure, one of ordinary skill in the art may realize many other applications and embodiments of the present invention.

Preferably, each exposure tool used at a manufacturing facility or foundry may be simulated and tested using an embodiment of the present invention to develop an exhaustive set of forbidden pitch data. Also it would be preferable to update all relevant design rules to incorporate such forbidden pitch data. Doing so would enable future designs using such updated design rules to be less susceptible to encountering forbidden pitch phenomenon during testing and production. Thus, the implementation of an embodiment of the present invention may provide a number of advantages for a semiconductor designer, a manufacturer, and/or a foundry, including (but not necessarily limited to):

- Providing lithography-friendly design rules for current and future technology generations;
- Providing the ability to avoid encountering forbidden pitches at the design stage by updating design rules with forbidden pitch data;
- Improving critical dimension uniformity;
- Improving process latitude obtainable using currently known semiconductor device manufacturing tools and techniques;
- Improving chip yield;
- Improving wafer sort yield; and/or
- Improving speed-binning of final products.

It will be appreciated by those skilled in the art having the benefit of this disclosure that embodiments of the present invention provide ways to identify forbidden pitches and implement forbidden pitch data into design rules for semiconductor fabrication. It should be understood that the drawings and detailed description herein are to be regarded in an illustrative rather than a restrictive manner, and are not intended to limit the invention to the particular forms and examples disclosed. On the contrary, the invention includes any further modifications, changes, rearrangements, substitutions, alternatives, design choices, and embodiments apparent to those of ordinary skill in the art, without departing from the spirit and scope of this invention, as defined by the following claims. Thus, it is intended that the following claims be interpreted to embrace all such further modifications, changes, rearrangements, substitutions, alternatives, design choices, and embodiments.

What is claimed is:

1. A method of identifying forbidden pitches for a lithographic exposure tool, comprising:
   selecting a set of exposure conditions;
   performing a simulation of an actual lithographic exposure process using a computer model, wherein the performing of the simulation comprises:
      selecting a set of pattern pitches for a certain target critical dimension, and
      running the computer model using the selected set of exposure conditions for at least some of the pattern pitches from the set of pattern pitches to obtain a corresponding set of depth-of-focus (DOF) values for each pitch ran;
   determining whether the DOF values are greater than a focus budget of the exposure tool for a set of frequently used pitches;
   if the DOF values are not greater than the focus budget of the exposure tool for the set of frequently used pitches, selecting a new set of exposure conditions and re-performing the simulation using the new set of exposure conditions;
   if the DOF values are greater than the focus budget of the exposure tool for the set of frequently used pitches, performing a verification test comprising:
      providing a test mask having formed therein at least one of the pattern pitches used in a last performed simulation,
      exposing a wafer through the test mask using the exposure tool and using the set of exposure conditions of the last performed simulation, and
      determining an actual DOF value for at least one of the exposed pattern pitches;
   for at least some of the exposed pattern pitches, comparing the corresponding actual DOF value with the focus budget of the exposure tool; and
   if the actual DOF value is not greater than the focus budget of the exposure tool, designating that actual DOF value's corresponding pattern pitch as a forbidden pitch.

2. The method of claim 1, wherein the exposure tool refers to a certain make or model of exposure tool.

3. The method of claim 1, wherein the exposure tool is one particular exposure tool.

4. The method of claim 1, further comprising:
   compiling a list of the designated forbidden pitches; and
   updating a design rule with the list of forbidden pitches.

5. The method of claim 1, further comprising:
   identifying groups of adjacent forbidden pitches, if any;
   forming one or more forbidden pitch ranges based on the identified groups of adjacent forbidden pitches; and
   integrating information regarding the forbidden pitch range(s) into a design rule such that the forbidden pitch range(s) are restricted from use.

6. The method of claim 1, wherein the test mask has formed therein one of the pattern pitches used in the last performed simulation.

7. The method of claim 1, wherein the test mask has formed therein all of the pattern pitches used in the last performed simulation.

8. The method of claim 1, wherein the set of frequently used pitches consists of one pitch.

9. The method of claim 1, wherein the set of frequently used pitches comprises two or more pitches.

10. The method of claim 1, wherein the set of exposure conditions comprises a numerical aperture value.

11. The method of claim 1, wherein the set of exposure conditions comprises a sigma value.

12. The method of claim 1, wherein the set of exposure conditions comprises an illumination condition.

13. The method of claim 1, further comprising:
    using information about the designated forbidden pitch (es) while drawing an integrated circuit layout in avoid implementing the designated forbidden pitch(es) into the integrated circuit layout.

14. The method of claim 1, further comprising:
    implementing information about the designated forbidden pitch(es) into a software program; and
    using the software program to search for the designated forbidden pitch(es) in an integrated circuit layout.

15. The method of claim 14, further comprising:
    modifying the integrated circuit layout by:
       eliminating designated forbidden pitch(es) found during the search from a pattern of the integrated circuit layout; and
       replacing the eliminated forbidden pitch with an allowed pitch in the pattern.

16. A method of adding information about forbidden pitches for a lithography exposure tool to a design rule relating to fabrication of semiconductor devices, comprising:
    selecting a set of exposure conditions;
    performing a simulation of an actual lithographic exposure process using a computer model, wherein the performing of the simulation comprises:
       selecting a set of pattern pitches for a certain target critical dimension, and
       running the computer model using the selected set of exposure conditions for at least some of the pattern pitches from the set of pattern pitches to obtain a corresponding set of depth-of-focus (DOF) values for each pitch ran;
    determining whether the DOF values are greater than a focus budget of the exposure tool for a set of frequently used pitches;
    if the DOF values are not greater than the focus budget of the exposure tool for the set of frequently used pitches, selecting a new set of exposure conditions and re-performing the simulation using the new set of exposure conditions;
    if the DOF values are greater than the focus budget of the exposure tool for the set of frequently used pitches, performing a verification test comprising:
       providing a test mask having formed therein at least one of the pattern pitches used in a last performed simulation,
       exposing a wafer through the test mask using the exposure tool and using the set of exposure conditions of the last performed simulation, and
       determining an actual DOF value for at least one of the exposed pattern pitches;
    for at least some of the exposed pattern pitches, comparing the corresponding actual DOF value with the focus budget of the exposure tool;
    if the actual DOF value is not greater than the focus budget of the exposure tool, designating that actual DOF value's corresponding pattern pitch as a forbidden pitch; and adding information about the forbidden pitch(es) for the exposure tool to the design rule.

17. The method of claim 16, further comprising:
defining a forbidden pitch range based on the actual DOF values from the verification test performed, wherein the defining of the forbidden pitch range comprises:
identifying groups of adjacent forbidden pitches, if any, and
designating the forbidden pitch range, wherein the forbidden pitch range comprises one or more adjacent forbidden pitches; and
adding information regarding the defined forbidden pitch range into the design rule.

18. The method of claim 17, further comprising integrating the information regarding the defined forbidden pitch range into the design rule such that the defined forbidden pitch range a restricted from use.

19. The method of claim 16, further comprising integrating the information regarding the forbidden pitch(es) into the design rule such that the forbidden pitch(es) a restricted from use.

20. The method of claim 16, wherein the exposure tool refers to a certain make or model of exposure tool.

21. The method of claim 16, wherein the exposure tool is one particular exposure tool.

22. The method of claim 16, wherein the test mask has formed therein one of the pattern pitches used in the last performed simulation.

23. The method of claim 16, wherein the test mask has formed therein all of the pattern pitches used in the last performed simulation.

24. The method of claim 16, wherein the set of frequently used pitches consists of one pitch.

25. The method of claim 16, wherein the set of frequently used pitches comprises two or more pitches.

26. The method of claim 16, wherein the set of exposure conditions comprises a numerical aperture value, a sigma value, and/or an illumination condition.

27. A method of constraining a design rule relating to fabrication of semiconductor devices, comprising:
selecting a set of exposure conditions;
performing a simulation of an actual lithographic exposure process using a computer model, wherein the performing of the simulation comprises:
selecting a set of pattern pitches for a certain target critical dimension, and
running the computer model that simulates an exposure tool using the selected set of exposure conditions for at least some of the pattern pitches from the set of pattern pitches to obtain a corresponding set of depth-of-focus (DOF) values for each pitch ran;
determining whether the DOF values are greater than a focus budget of the exposure tool for a set of frequently used pitches;
if the DOF values are not greater than the focus budget of the exposure tool for the set of frequently used pitches, selecting a new set of exposure conditions and re-performing the simulation using the new set of exposure conditions;
if the DOF values are greater than the focus budget of the exposure tool for the set of frequently used pitches, performing a verification test comprising:
providing a test mask having formed therein at least one of the pattern pitches used in a last performed simulation,
exposing a wafer through the test mask using the exposure tool and using the set of exposure conditions of the last performed simulation, and
determining an actual DOF value for at least one of the exposed pattern pitches;
defining one or more forbidden pitch ranges based on the actual DOF values from the verification test performed, wherein the defining of each forbidden pitch range comprises:
for at least some of the exposed pattern pitches, comparing the corresponding actual DOF value with the focus budget of the exposure tool,
if the actual DOF value is not greater than the focus budget of the exposure tool, designating that actual DOF value's corresponding pattern pitch as a forbidden pitch,
identifying groups of adjacent forbidden pitches, if any, and
forming the forbidden pitch range based on the identified groups of adjacent forbidden pitches; and
integrating information regarding the defined forbidden pitch range(s) into the design rule such that the defined forbidden pitch range(s) a restricted from use.

28. The method of claim 27, wherein the exposure tool refers to a certain make or model of exposure tool.

29. The method of claim 27, wherein the exposure tool is one particular exposure tool.

* * * * *